United States Patent
Mangat et al.

(10) Patent No.: US 6,653,053 B2
(45) Date of Patent: Nov. 25, 2003

(54) METHOD OF FORMING A PATTERN ON A SEMICONDUCTOR WAFER USING AN ATTENUATED PHASE SHIFTING REFLECTIVE MASK

(75) Inventors: Pawitter Mangat, Gilbert, AZ (US); Sang-In Han, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 118 days.

(21) Appl. No.: 09/940,241

(22) Filed: Aug. 27, 2001

(65) Prior Publication Data

US 2003/0039923 A1 Feb. 27, 2003

(51) Int. Cl.$^7$ .............................. G03F 7/00; G03F 7/20; G03F 9/00

(52) U.S. Cl. ........................... 430/311; 430/5; 430/313; 430/316; 430/317; 430/318; 430/322; 430/323; 430/396

(58) Field of Search ............................. 430/5, 311, 313, 430/316, 317, 318, 322, 323, 396

(56) References Cited

U.S. PATENT DOCUMENTS

| | | | | |
|---|---|---|---|---|
| 4,890,309 | A | | 12/1989 | Smith et al. .................... 378/35 |
| 5,052,033 | A | | 9/1991 | Ikeda et al. .................... 378/35 |
| 5,521,013 | A | | 5/1996 | Griffin et al. ................ 428/480 |
| 5,700,602 | A | * | 12/1997 | Dao et al. ........................ 430/5 |
| 5,939,227 | A | | 8/1999 | Smith ............................... 430/5 |
| 6,013,399 | A | * | 1/2000 | Nguyen .......................... 430/5 |
| 6,207,333 | B1 | * | 3/2001 | Adiar et al. .................... 430/51 |
| 6,235,434 | B1 | | 5/2001 | Sweeney et al. ................ 430/5 |
| 6,261,723 | B1 | * | 7/2001 | George et al. ................. 430/5 |
| 6,447,962 | B2 | * | 9/2002 | Yang .............................. 430/5 |
| 2002/0132174 | A1 | * | 9/2002 | Pierrat ........................... 430/5 |
| 2003/0000921 | A1 | * | 1/2003 | Liang et al. ................... 216/59 |

OTHER PUBLICATIONS

Chang Hyun Cho et al., "Fabrication of Attenuated Phase Shift Mask for EUV Lithography", not published, Non-Confidential Communication, May 2000, 14 pgs.

O.R. Wood et al., "Use of attenuated phase masks in extreme ultraviolet lithography", J. Vac. Sci. Technol. B 15(6), Nov./Dec. 1997 American Vacuum Society, pp. 2448–2451.

D.M. Tennant et al., "Reflective mask technologies and imaging results in soft x–ray projection lithography", J. Vac. Sci. Technol. B 9 (6), Nov./Dec. 1991 American Vacuum Society, pp. 3176–3183.

H.L. Chen et al., "Simulation on a New Reflection Type Attenuated Phase Shifting Mask for Extreme Ultraviolet Lithography", Part of SPIE Conference on Emerging Lithographic Technologies III, Santa Clara, CA, Mar. 1999, SPIE vol. 3676, pp. 578–586.

Marc D. Levenson et al., "Improving Resolution in Photolithography with a Phase–Shifting Mask", 1982 IEEE Transactions On Electron Devices, vol. ED–29, No. 12, Dec. 1982, 9 pgs.

(List continued on next page.)

Primary Examiner—Mark F. Huff
Assistant Examiner—Nicole Barreca
(74) Attorney, Agent, or Firm—Kim-Marie Vo; James L. Clingan, Jr.

(57) ABSTRACT

A desirable pattern is formed in a photoresist layer that overlies a semiconductor wafer using an attenuating phase shift reflective mask. This mask is formed by consecutively depositing an attenuating phase shift layer, a buffer layer and a repairable layer. The repairable layer is patterned according to the desirable pattern. The repairable layer is inspected to find areas in which the desirable pattern is not achieved. The repairable layer is then repaired to achieve the desirable pattern with the buffer layer protecting the attenuating phase shift layer. The desirable pattern is transferred to the buffer layer and then transferred to the attenuating phase shift layer to achieve the attenuating phase shift reflective mask. Radiation is reflected off the attenuating phase shift reflective mask to the photoresist layer to expose it with the desirable pattern.

12 Claims, 3 Drawing Sheets

OTHER PUBLICATIONS

D.M. Tennant et al., "Defect repair for soft x-ray projection lithography masks", J. Vac. Sci. Technol. B 10(6), Nov./Dec. 1992 American Vacuum Society, pp. 3134-3140.

Y.-C. Ku et al., "Use of a pi-phase shifting x-ray mask to increase the increase the intensity slope at feature edges", J. Vac. Sci. Technol. B, vol. 6, No. 1, Jan./Feb. 1988, pp. 150-153.

Pawitter Mangat et al., "EUV mask fabrication with Cr absorber", 2000 by the Society of Photo-Optical Instrumentation Engineers, Proceedings of SPIE vol. 3997, pp. 76-82.

Stephen P. Vernon et al., "Masks for extreme ultraviolet lithography", BACUS Symposium on Photomask Tech./Mgmt., SPIE vol. 3546, pp. 184-193.

Donald W. Pettibone et al., "UV Inspection of EUV and SCALPEL Reticles", 20th Annual BACUS Symposium on Photomask Tech., Proceedings of SPIE vol. 4186 (2001), pp. 241-249.

P.J.S. Mangat et al., "Extreme ultraviolet lithography mask patterning and printability studies with a Ta-based absorber", 1999 American Vacuum Society, 5 pages.

Pei-yang Yan et al., "EUV Mask patterning approaches", SPIE Conference on Emerging Lithographic Technologies III, SPIE vol. 3676, pp. 309-313.

Pei-yang Yan et al., "EUV Mask Absorber Defect Repair with Focused Ion Beam", BACUS Symposium on Photomask Tech./Mgmt., SPIE Vol. 3546, pp. 206-213.

Scott D. Hector et al., "Predictive model of the cost of extreme ultraviolet lithography masks", BACUS Symposium on Photomask Tech., SPIE vol. 4186 (2001), pp. 733-748.

* cited by examiner

METHOD OF FORMING A PATTERN ON A SEMICONDUCTOR WAFER USING AN ATTENUATED PHASE SHIFTING REFLECTIVE MASK

RELATED APPLICATION

This is related to U.S. patent application Ser. No. 09/414,735 filed Oct. 8, 1999 now U.S. Pat. No. 6,596,465, and entitled "Method of Manufacturing a Semiconductor Component" and is assigned to the current assignee hereof.

FIELD OF THE INVENTION

The invention relates, generally, to semiconductor manufacturing and more particularly to attenuated phase shifting reflective lithography.

BACKGROUND OF THE INVENTION

Currently, transmission optical photolithography is used to form patterned layers in semiconductor manufacturing. Since the ability to resolve the semiconductor devices features during photolithography is directly proportional to the wavelength of the light source, the wavelength of the light source needs to decrease as device dimensions decrease. To pattern device dimensions less than approximately 70 nanometers, one option is to use a light source with a wavelength in the extreme ultra-violet (EUV) regime. As used herein, the EUV regime has a characteristic wavelength between approximately 4–25 nanometers and more specifically 13–14 nanometers. Since it is difficult to find a material that transmits EUV radiation when exposed to wavelengths in the EUV regime, EUV operates in a reflective mode as opposed to the transmission mode. Hence, the EUV masks are reflective in nature and not transmissive like the masks for optical photolithography or other technology options such as Electron Projection lithography or Ion projection lithography.

The concept of attenuated phase shifting has been used in order to improve the resolution of small features in transmission optical photolithography and can be extended to EUV lithography. In transmission optical photolithography, the thickness of the mask substrate is altered to form phase shifting attenuated layers. Changing the thickness of an EUV mask, however, is undesirable because it alters the reflective properties of the mask. One solution to this problem is to form an attenuated phase shifting layer using photoresist as a mask. In practice, however, using photoresist as a mask layer during pattern transfer process generates pattern errors, resulting in the need for inspection and repair of the mask. In this case, repairing the attenuated phase shifting layer can damage the underlying reflective layer as well as alter the phase shifting characteristics, thus decreasing the reflectivity of the mask and consequently making the mask unusable. Thus, a need exists for a process for forming an attenuated phase shifting EUV mask that allows for inspection and repair after photoresist pattern transfer without damaging the reflective layer of the mask.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one embodiment, a mask substrate including a reflective layer of a plurality of alternating molybdenum and silicon layers and an attenuating phase shift layer is formed by transferring a pattern from a photoresist layer to the phase shifting layer via a hard mask layer and a buffer layer. If necessary, the hard mask layer can be repaired. The attenuated phase shifting reflective mask is used to pattern a photoresist layer on a semiconductor wafer by reflecting radiation from the attenuated phase shifting reflective mask, which has a desired pattern, to the photoresist on the semiconductor wafer to expose the desired pattern on the photoresist. The present invention is better understood by turning to the drawings.

Figure 1:
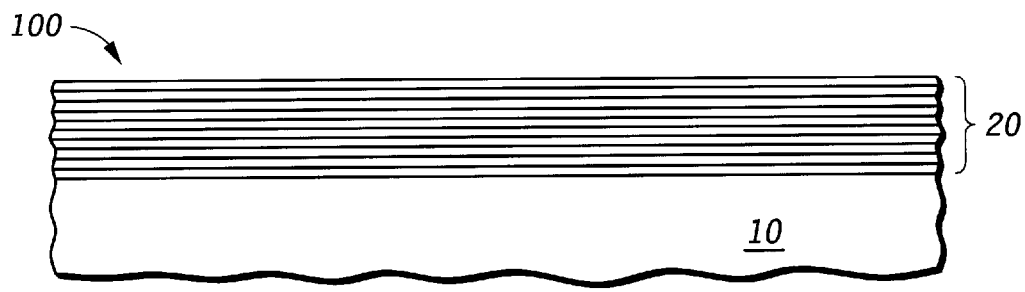
FIG. 1 illustrates a portion of a mask substrate after forming a reflective layer in accordance with an embodiment of the present invention.

Shown in FIG. 1 is the starting point for forming an attenuated phase shifting mask 100, which includes a mask substrate 10 and a reflective layer 20. The mask substrate 10 is a low thermal expansion (LTE) material, which as used herein has a coefficient of thermal expansion (CTE) of less than approximately 30 particles per million (ppm) per degree Kelvin at +/-22 degrees Celsius; a low defect density, which used herein is approximately less than 0 defects greater than approximately 50 nanometers Poly Styrene Latex (PSL) sphere equivalent and low surface roughness, which used herein is less than approximately 50 nanometers peak to valley flatness. In addition, the mask substrate 10 should be able to mechanically support any overlying layers during the manufacturing process of the mask and the fabrication process of the semiconductor device. In one embodiment, the mask substrate can be a high-quality silica, such as ULE® zero expansion glass provided by Corning.

The reflective layer 20 is a multi-layer stack and, preferably, comprises a stack of 40-layer pairs of silicon and molybdenum layers with a periodicity of about 7 nm, wherein a molybdenum layer is in contact with the mask surface and a silicon layer is the top layer of the reflective layer 20. Ion beam deposition (IBD), magnetron sputtering, E-beam evaporation or the like can be used to deposit the silicon and molybdenum multi-layer stack. Optionally, a capping layer of a reflective material can be formed over the reflective layer 20.

Figure 2:
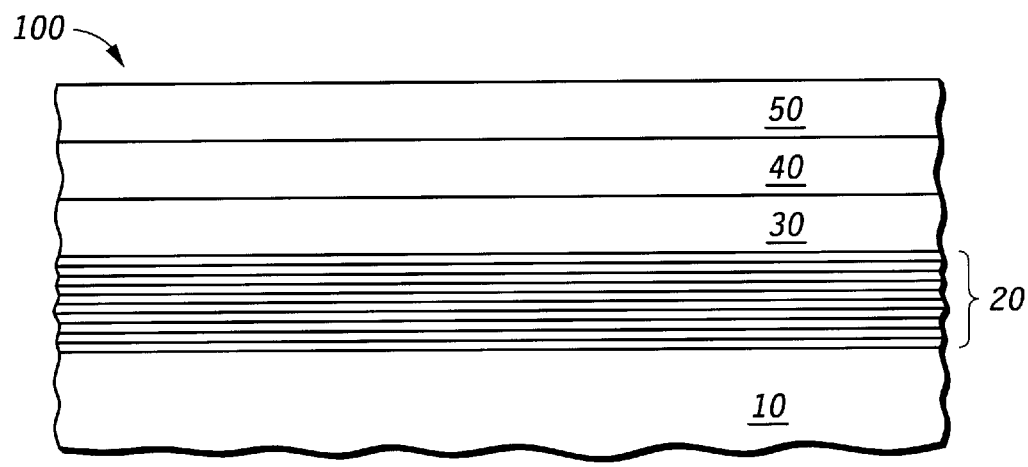
FIG. 2 illustrates the mask of FIG. 1 after forming an attenuated phase shifting layer, a buffer layer and a hard mask layer.

Shown in FIG. 2 is the mask 100 after forming the reflective layer 20, an attenuated phase shifting layer 30, a buffer layer 40, and a repairable layer or hard mask layer 50. The attenuated phase shifting layer 30 can be chrome or chromium formed over the reflective layer 20 by sputter deposition. Generally, the attenuated phase shifting layer 30 is approximately 40–50 nm, which creates an 180 degree phase shift and 6~10% attenuation. The buffer layer 40 includes silicon and oxygen, or more specifically, is a silicon oxynitride deposited by plasma enhanced chemical vapor deposition (PECVD). Generally, the buffer layer 40 is approximately 30–50 nm. Over the buffer layer 40, the repairable layer 50, in one embodiment, is an approximately 50–80 nm thick layer of tantalum silicon nitride formed by sputter deposition. Additionally, the layers formed over the reflective layer 20 can be formed by any process performed at a temperature less than approximately 150 degrees Celsius in order to not cause interdiffusion within the reflective layer 20 resulting in degradation of the reflective properties of the multilayers.

Figure 3:
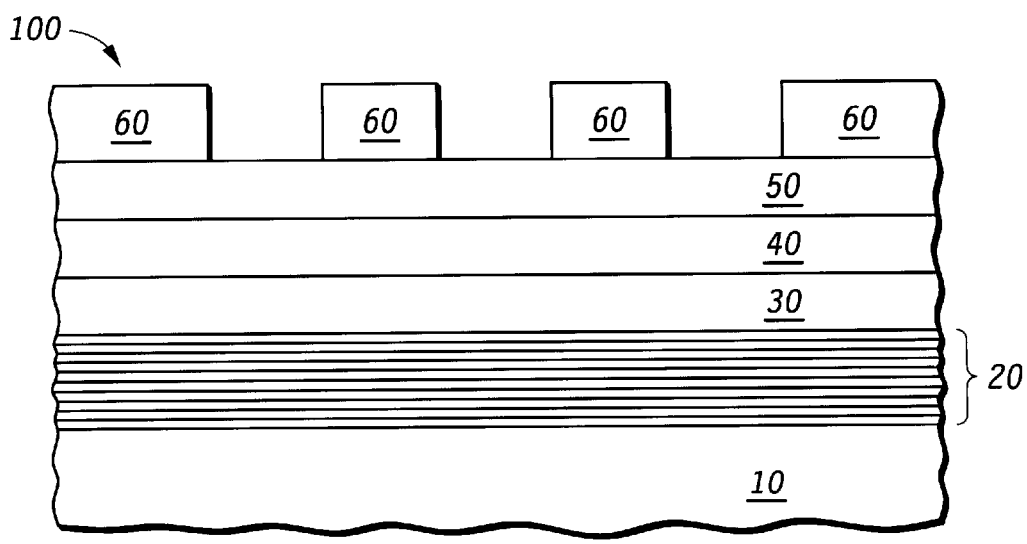
FIG. 3 illustrates the mask of FIG. 2 after forming a patterned photoresist layer.

Shown in FIG. 3 is the mask 100 after a first photoresist layer 60 is deposited and patterned over the repairable layer 50 to result in a patterned photoresist layer 60. As will be better understood after further discussion in regards to FIG. 8, the openings formed in the patterned photoresist layer 60, will correspond to the opening formed in a second photoresist layer formed on a semiconductor wafer, if the second photoresist layer is positive photoresist. If the second photoresist is negative photoresist, the openings formed in the patterned photoresist layer 60 will correspond to the portions of the second photoresist that will remain after exposure of the second photoresist layer.

Figure 4:
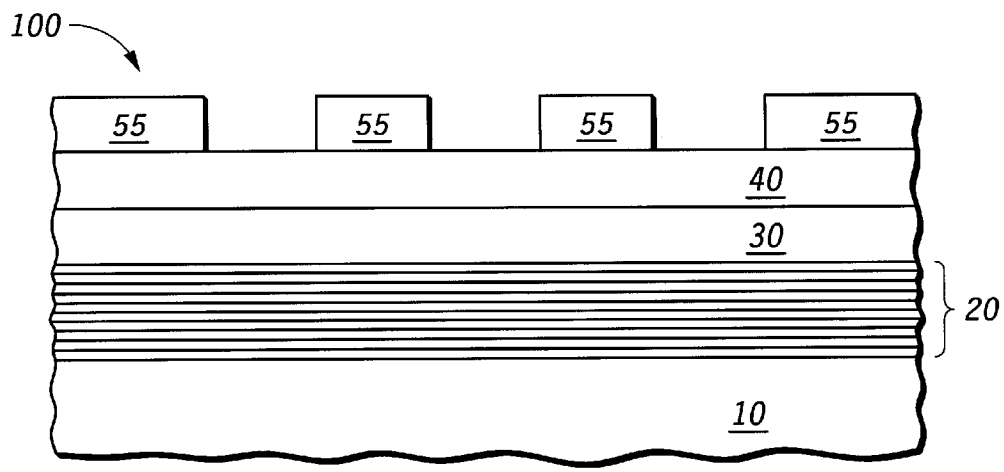
FIG. 4 illustrates the mask of FIG. 3 after patterning the hard mask layer.

Shown in FIG. 4 is the mask 100 after the patterned photoresist layer 60 is patterned and the repairable layer 50 is etched using the patterned photoresist layer 60 as a first mask to form a patterned repairable layer 55. In other words, a desired pattern from the photoresist layer is transferred to the repairable layer 50. A chlorine-containing chemistry, such as $Cl_2$, can be used in a plasma etch process, such as reactive ion etch (RIE), to remove portions of the repairable layer 50. After etching the repairable layer 50, the patterned photoresist layer 60 is removed using conventional methods, such as an ash process.

Figure 5:
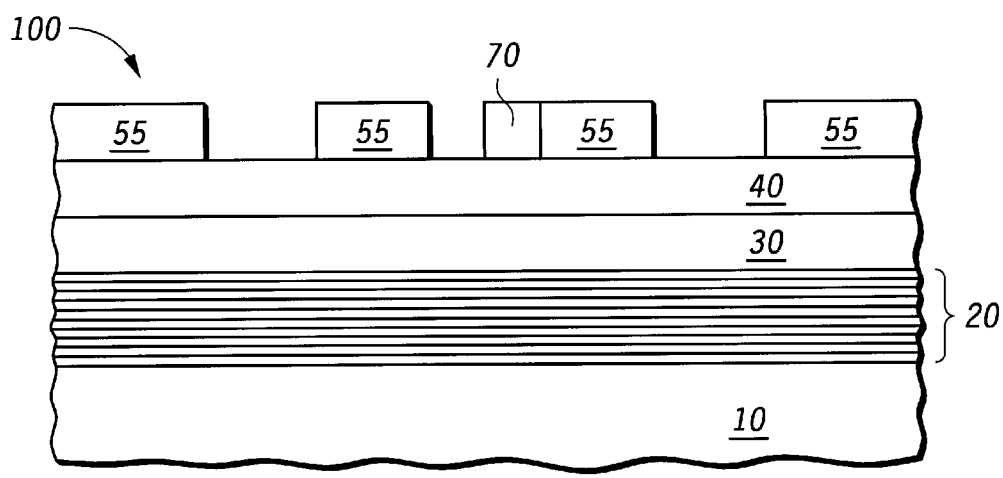
FIG. 5 illustrates the mask of FIG. 4 after repairing the hard mask layer.

Shown in FIG. 5 is the mask 100 after the patterned repairable layer 55 is formed. The patterned repairable layer 55 is then inspected using light with a deep ultra-violet wavelength, which is between approximately 365 nm and 193 nm. The patterned repairable layer 55 is compared to a desired pattern to determine if any portions of the patterned repairable layer 55 are undesirably added or missing. If any defects are found, the patterned repairable layer 55 is repaired by either removing portions of the patterned repairable layer 55 or adding a metal 70, such as tantalum, tungsten, platinum, or the like, using a focused ion beam (FIB) to match the desired pattern and result in the patterned repaired layer. The patterned repaired layer includes the patterned repairable layer 55 after repair and the metal 70, if added.

Figure 6:
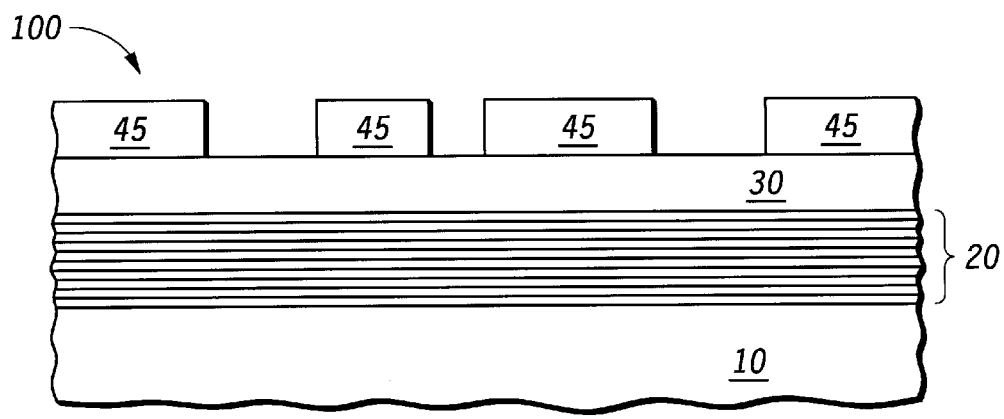
FIG. 6 illustrates the mask of FIG. 5 after patterning the buffer layer.

Shown in FIG. 6 is the mask 100 after inspecting and repairing the patterned repairable layer 55. The buffer layer 40 is etched using the patterned repaired layer as a second mask to form a patterned buffer layer 45. The buffer layer 40 is etched selective to the attenuated phase shifting layer 30 using a fluorine-based chemistry, such as $CHF_3$, resulting in a patterned buffer layer 45. A wet or dry etch, such as a plasma etch, can be used. After patterning the buffer layer 40, the repairable layer 50 is removed by a dry etch using a chlorine-containing chemistry. In one embodiment the patterned buffer layer 45 is inspected after etching the buffer layer 40 and the patterned buffer layer 45 is repaired if the patterned buffer layer 45 has a defect.

Figure 7:
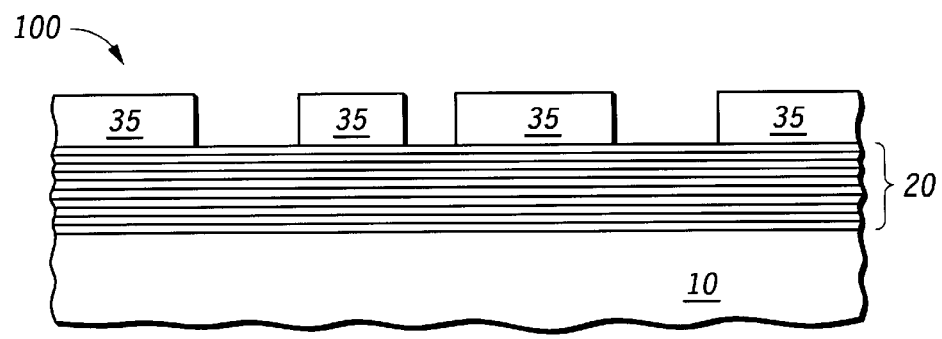
FIG. 7 illustrates the mask of FIG. 6 after patterning the attenuated phase shifting layer.

Shown in FIG. 7 is the mask 100 after the attenuated phase shifting layer 30 is etched selective to the reflective layer 20 using the patterned buffer layer 45 as a third mask to form a patterned attenuated phase shifting layer 35. In other words, the desired pattern from the repairable layer 50 is transferred to the attenuated phase shifting layer to form an attenuated phase shifted reflective mask 100. The patterned attenuated phase shifting layer 35 and the reflective layer 20 and the mask substrate 10 form the attenuated phase shifting reflective mask 100. The attenuated phase shifting layer 30 is dry etched using a chlorine and oxygen containing chemistry, such as $Cl_2$ and $O_2$. After patterning the attenuated phase shifting layer 30, the patterned buffer layer 45 is removed by either dry etching using a fluorine-containing chemistry or wet etching.

Figure 8:
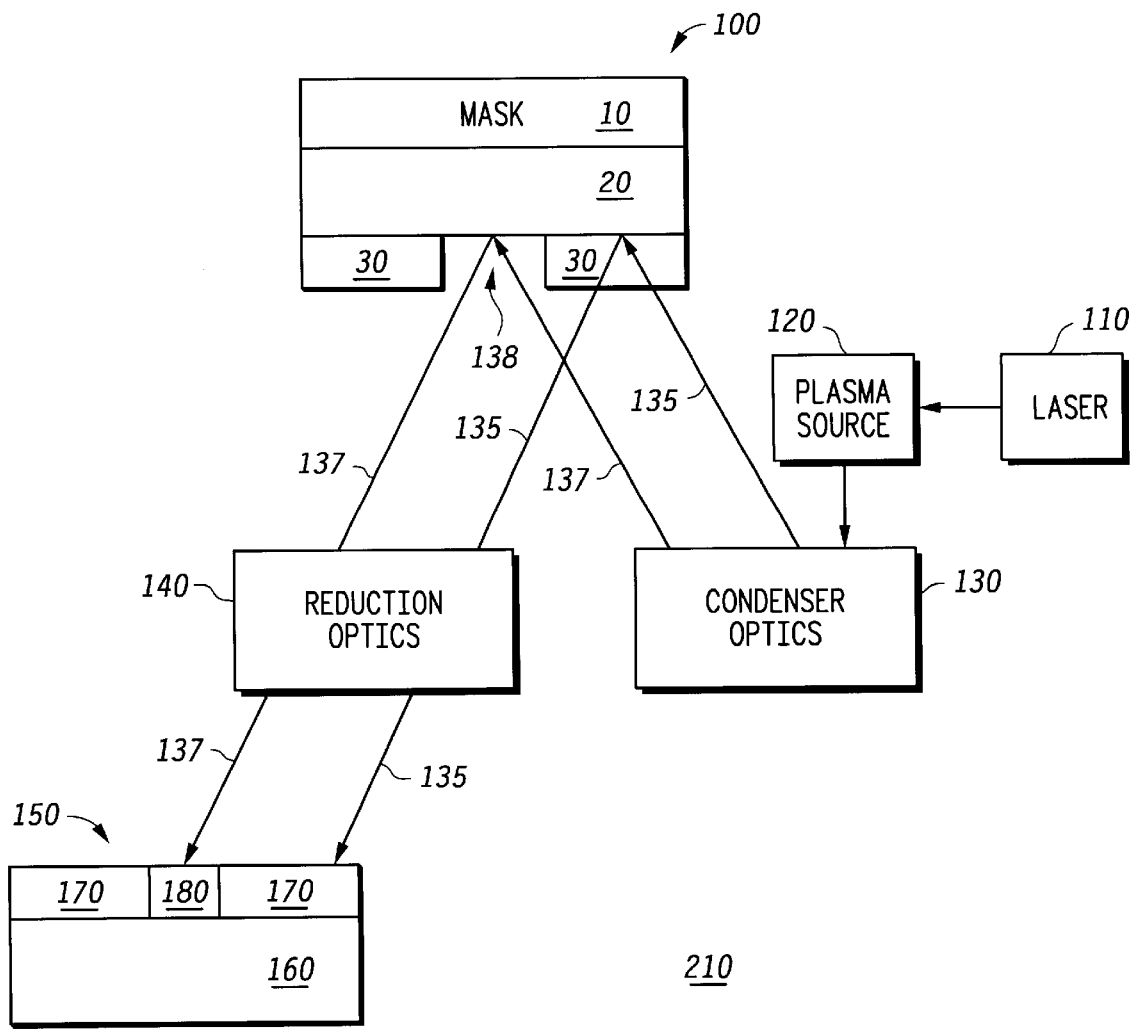
FIG. 8 illustrates using the mask of FIG. 7 to pattern a semiconductor device.

Shown in FIG. 8 is a photolithographic system 210 for using the attenuated phase shifting reflective mask 100 to pattern a semiconductor wafer or device 150. The photolithographic system 210 includes a laser 110, a plasma source 120, condenser optics 130, the attenuated phase shifting reflective mask 100, reduction optics 140 and the semiconductor device 150. Although a variety of sources can provide EUV radiation, a laser produced plasma source 120 is shown. The source uses a high powered pulsed laser 110, such as Nd:YAG, for activating a supersonic gas jet, such as xenon gas jet. The xenon atomic clusters are heated to high temperatures resulting in the formation of a plasma source 120. From the plasma source 120 radiation with a wavelength in the EUV regime is emitted and focused by the condenser optics 130 into collimated light or radiation 135 and 137. The collimated light 135 is projected onto the mask 100 at an angle, which is typically approximately 5 degrees with respect to the perpendicular axis of the mask 100, and reflected. The light 135 that is reflected off of the attenuated phase shifting layer 30 is approximately 6–10% of the intensity of the light reflected from the light 137 that is reflected off of the openings 138, which expose the reflective layer 20 of the mask 100. In other words, the thickness of the attenuating phase shift layer is sufficient to cause reflection of the radiation through the shift attenuating layer with at least 90% attenuation in relation to the radiation reflected form the reflective layer. The light 135 that reflects off of the interface between the reflective layer 20 and the attenuated phase shifting layer 30 will be 180 degrees out of phase relative to the light 137. The reflected light travels through reduction optics 140, which reflect the light in order to shrink the pattern on the mask 100. Typically, the reduction optics 140 reduces the pattern on the mask 100 by four or five times. From the reduction optics 140, the light 135 and 137 illuminates the second photoresist layer on the semiconductor device 150. The semiconductor device 150 includes the second photoresist layer and a semiconductor substrate 160, which is preferably monocrystalline silicon, but can be any other semiconductor material such as gallium arsenide, germanium, and the like. The semiconductor substrate 160 may have any number of layers or structures formed within the semiconductor substrate 160 or under the second photoresist layer. If the second photoresist layer is positive, the non phase-shifted light 135 will expose a first area 180 and the phase shifted light 137 will not expose the second areas 170 of the photoresist. If negative photoresist is used, the opposite scenario will occur.

Forming the attenuated phase shifting reflective mask described allows for inspection and repair of the mask without damaging the attenuated phase shifting layer. Furthermore, a mask is formed with defect-free layers in order to pattern the photoresist on the semiconductor wafer with small dimensions.

Other materials than those described above may be used for the layers on the attenuated phase shifting mask 100. For example, the reflective layer 20 may include a multi-layer stack of beryllium and molybdenum or any other layer or layers with suitable reflective, In one embodiment, the attenuated phase shifting layer 30 includes a metal. The attenuated phase shifting layer 30 can include ruthenium and germanium or can include multiple layers. For example, the phase shifting layer 30 can be a chrome oxide or chromium oxide layer over a chrome or chromium layer. Any refractory metal-containing material, such as tantalum silicon oxide, tantalum nitride, tungsten, titanium nitride or the like, can be used for the repairable layer 50. In one embodiment, the repairable layer 50 is selectively etchable with respect to the buffer layer 40.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of patterning a first photoresist layer on a semiconductor wafer using an attenuated phase shifting reflective mask, comprising:

providing a mask substrate having a reflective layer;

depositing an attenuating phase shift layer over the reflective layer;

depositing a buffer layer over the attenuating phase shift layer;

depositing a repairable layer over the buffer layer;

depositing a second photoresist layer over the repairable layer;

patterning the second photoresist layer to form a patterned photoresist layer;

etching the repairable layer using the patterned photoresist layer as a first mask to form a patterned repairable layer;

removing the patterned photoresist layer;

inspecting and repairing the patterned repairable layer to form a patterned repaired layer;

etching the buffer layer using the patterned repaired layer as a second mask to form a patterned buffer layer;

removing the patterned repaired layer;

etching the attenuating phase shift layer using the patterned buffer layer as a third mask;

removing the patterned buffer layer to form the attenuated phase shifting reflective mask;

applying the first photoresist to the semiconductor wafer; and reflecting radiation off the attenuated phase shifting reflective mask to the first photoresist on the semiconductor wafer to provide an exposed pattern on the photoresist.

2. The method of claim 1, further comprising:

inspecting the patterned buffer layer after etching the buffer layer; and repairing the patterned buffer layer if the patterned buffer layer has a defect.

3. The method of claim 1, wherein the attenuating phase shift layer is characterized as being selectively etchable with respect to the reflective layer.

4. The method of claim 3, wherein the attenuating phase shift layer comprises chromium.

5. The method of claim 3, wherein the attenuating phase shift layer comprises a material selected from chromium, ruthenium, and germanium.

6. The method of claim 3, wherein the attenuating phase shift layer comprises a metal.

7. The method of claim 3, wherein attenuating phase shift layer comprises:

a chromium layer; and a chromium oxide layer over the chromium layer.

8. The method of claim 1, wherein the buffer layer comprises silicon oxynitride.

9. The method of claim 1, wherein the repairable layer comprises tantalum silicon nitride.

10. The method of claim 1, wherein the reflective layer comprises a plurality of alternating layers of molybdenum and silicon.

11. The method of claim 1, wherein the buffer layer is selectively etchable with respect to the attenuating phase shift layer.

12. The method of claim 1, wherein the repairable layer is selectively etchable with respect to the buffer layer.

* * * * *